United States Patent
Fernandes

(10) Patent No.: US 8,607,108 B2
(45) Date of Patent: Dec. 10, 2013

(54) SCAN TESTING WITH CAPTURE CLOCK GENERATOR DRIVEN BY CLOCK DISTRIBUTION NETWORK

(75) Inventor: Denzil Savio Fernandes, Austin, TX (US)

(73) Assignee: Texas Instruments Incorporated, Dallas, TX (US)

( * ) Notice: Subject to any disclaimer, the term of this patent is extended or adjusted under 35 U.S.C. 154(b) by 225 days.

(21) Appl. No.: 13/204,973

(22) Filed: Aug. 8, 2011

(65) Prior Publication Data

US 2013/0038371 A1 Feb. 14, 2013

(51) Int. Cl.
*G01R 31/28* (2006.01)

(52) U.S. Cl.
USPC .......................................... 714/729; 714/731

(58) Field of Classification Search
USPC .......................................... 714/726, 729, 731
See application file for complete search history.

(56) References Cited

U.S. PATENT DOCUMENTS

| 7,562,275 | B2* | 7/2009 | Juhn et al. ...................... 714/726 |
| 7,617,425 | B2* | 11/2009 | Nadeau-Dostie et al. .... 714/719 |
| 7,752,513 | B2* | 7/2010 | Namura et al. ............... 714/726 |
| 7,840,861 | B2* | 11/2010 | Sul ................................ 714/726 |
| 7,840,864 | B2* | 11/2010 | Grise et al. .................... 714/726 |
| 8,244,492 | B2* | 8/2012 | Hafed ............................. 702/69 |

OTHER PUBLICATIONS

Jeff Rearick & Richard Rodgers, "Calibrating Clock Stretch During AC Scan Testing," in IEEE International Conference on Test, ITC-2005, vol. 1, pp. 266-273.

* cited by examiner

*Primary Examiner* — Esaw Abraham
(74) *Attorney, Agent, or Firm* — Ronald O. Neerings; Wade James Brady; Frederick J. Telecky, Jr.

(57) ABSTRACT

An electronic system is configured for scan testing, with a clock distribution network going to a plurality of blocks of the system, and a test capture clock being generated locally at each block. Capture clock pulses are optionally generated at different times for different blocks, and are optionally suppressed for some blocks.

20 Claims, 3 Drawing Sheets

SCAN TESTING WITH CAPTURE CLOCK GENERATOR DRIVEN BY CLOCK DISTRIBUTION NETWORK

BACKGROUND

Scan testing refers to a method of testing integrated circuits, printed circuit boards, and other electronic systems, by serially shifting in stimulus data, capturing a response to the stimulus, and serially shifting out the resulting response. An example of scan testing is a standard specified by IEEE 1149.1, also known as Boundary-scan testing. There is an ongoing need for improved scan testing.

SUMMARY

In scan testing functional circuitry of an electronic system, a capture clock generator that generates pulses for capturing the state of the functional circuitry is driven by the system's clock distribution network. This permits the clock distribution network to remain always active, which aids in avoiding distortion of the capture pulses.

DETAILED DESCRIPTION

Figure 1A:
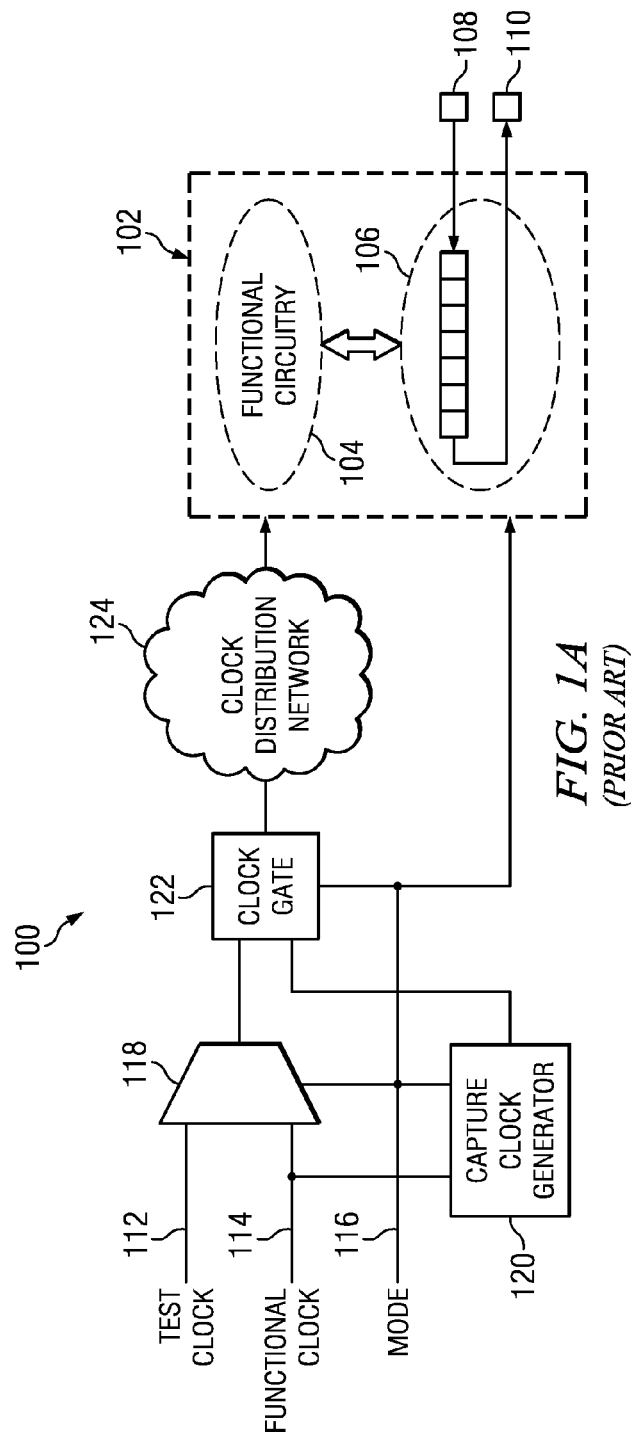
FIG. 1A is a simplified block diagram illustrating an example prior art embodiment of an electronic system configured for scan testing.

FIG. 1A illustrates an example prior art system 100 with provision for scan based testing. An electronic system 102 is being tested. The system 102 comprises Functional Circuitry 104 and Test Circuitry 106. The Test Circuitry 106 is depicted as a shift register. The elements of the shift register may be dedicated to testing, or they may be functional elements temporarily configured for testing. A sequence of "ones" and "zeros" (stimulus vector) is serially shifted in the Test Circuitry 106 through an external Test Access Port (TAP) 108. When the stimulus vector is in place, the mode of the Test Circuitry 106 is switched from shifting, to storing the output of the Functional Circuitry 104. The Test Circuitry 106 is clocked to "capture" the state of the Functional Circuitry 104. The resulting state captured by the Test Circuitry 106 is then serially shifted out another TAP 110. A new stimulus vector may be shifted into the Test Circuitry 106 as the previous result is shifted out, and the process may be repeated.

Some types of faults, such as opens, shorts, or nodes "stuck at" one signal level, may be detected statically or at a low clock frequency. Other types of faults of interest need to be tested at the normal clock frequency of the functional circuitry. For example, a bus may need to be tested with a stimulus of alternating ones and zeros on adjacent lines, and then the pattern may need to be reversed to maximize crosstalk between the adjacent lines, and the test needs to occur at the normal clock frequency of the bus.

In the example of FIG. 1A, when a Mode Signal 116 is at a first level (scan mode), a Multiplexer 118 selects a low-frequency Test Clock 112, and the Test Circuitry 106 is placed in a scan mode (a test vector is shifted in, and previously captured results may be shifted out). When the Mode signal 116 is at a second level (functional mode), the Multiplexer 118 selects a high-frequency Functional Clock 114, and the Test Circuitry 106 is placed into a capture mode. During normal functional operation, a Clock Gate 122 passes the high-frequency Functional Clock 114 to the Functional Circuitry 104. However, when the system is in functional mode during testing, the output of the Clock Gate 122 is determined by a Capture Clock Generator 120. The Capture Clock Generator 120 generates one or more capture pulses.

Figure 1B:
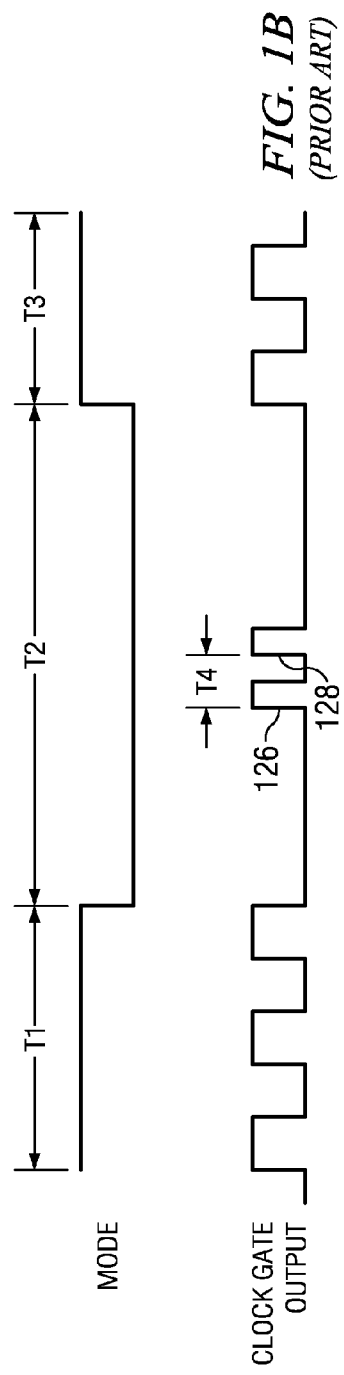
FIG. 1B is a timing diagram illustrating example timing for various signals in the system of FIG. 1A.

FIG. 1B is a timing diagram illustrating example timing of the output of the Clock Gate 122 and the Mode signal 116. During time T1, the Mode signal 116 is high, designating a scan mode. During time T1, the output of the Clock Gate 122 is the low-frequency Test Clock 112. During time T2, the Mode signal goes low to designate a capture mode. During time T2, the Capture Clock Generator 120 generates, for example, two capture pulses (126, 128) at the frequency of the Functional Clock 114, and the Mode signal 116 returns high to again designate a scan mode. During time T3, the output of the Clock Gate 122 is again the low-frequency test clock, and the Test Circuitry is placed in scan mode (captured results are shifted out, and a new test vector may be shifted in).

For many tests of interest, it is important for time T4 to be exactly the time between consecutive rising edges of the Functional Clock 114. In FIG. 1B, the two capture pulses (126, 128) are depicted as ideal pulses, perfectly symmetrical with precise zero rise times. In reality, for large systems with high-frequency clocks, the capture pulses may be significantly distorted. For a large system, the Clock Distribution Network may be a tree structure, or a mesh, with multiple drive circuits and multiple levels. The Clock Distribution Network (FIG. 1A, 124) may have the characteristics of a transmission line, with distributed capacitance and inductance. In addition, inter-connects (for example, solder bumps) have some inherent parasitic inductance, and circuit component layout results in some inherent parasitic capacitance. As a result, there are distortions and phase delays at the leading edges of the resulting clock signals. When the functional circuitry is operating in a steady state, the various inductances in the Clock Distribution Network have some average current, the various capacitances have some average voltage, and the condition of the network is the same for each clock pulse. In contrast, in FIG. 1B, during time T2, the currents and voltages in the reactances in the Clock Distribution Network have time to change toward a quiescent state, so the initial network conditions for the first capture pulse 126 are different than the network conditions for the second capture pulse 128, with the result that the leading edges of the two pulses are distorted differently.

In addition to transmission line effects, and effects of network parasitic reactances, the first capture pulse will cause a transient increase in power supply current and a transient dip in power supply voltage. The response time of the power supply will typically be such that the power supply voltage may still be dropping at the time of the second capture pulse, causing the second capture pulse to be distorted differently than the first capture pulse. In addition, the power supply transient may be worse during testing than power supply transients experienced during normal operation. For example, for low-power microprocessor systems for mobile applications, the power supply specifications may assume, for example, that at any given time, part of the functional circuitry is in a low-power mode, and that only about 15% to 20% of the circuitry changes states at any one clock pulse. In contrast, during testing, more of the system may be active, and test-patterns may cause a large percentage of the circuitry to change states at the first capture pulse.

The net result of transmission line effects, parasitic reactances, and power supply transients, is that time T4 in FIG. 1B (the effective time between the rising edges of the two capture pulses 126 and 128) may be significantly different than the time between two consecutive rising edges of the Functional Clock 114 during normal steady-state operation, and the test results may not accurately reflect the results of the Functional Circuitry 104 during normal conditions.

Figure 2A:
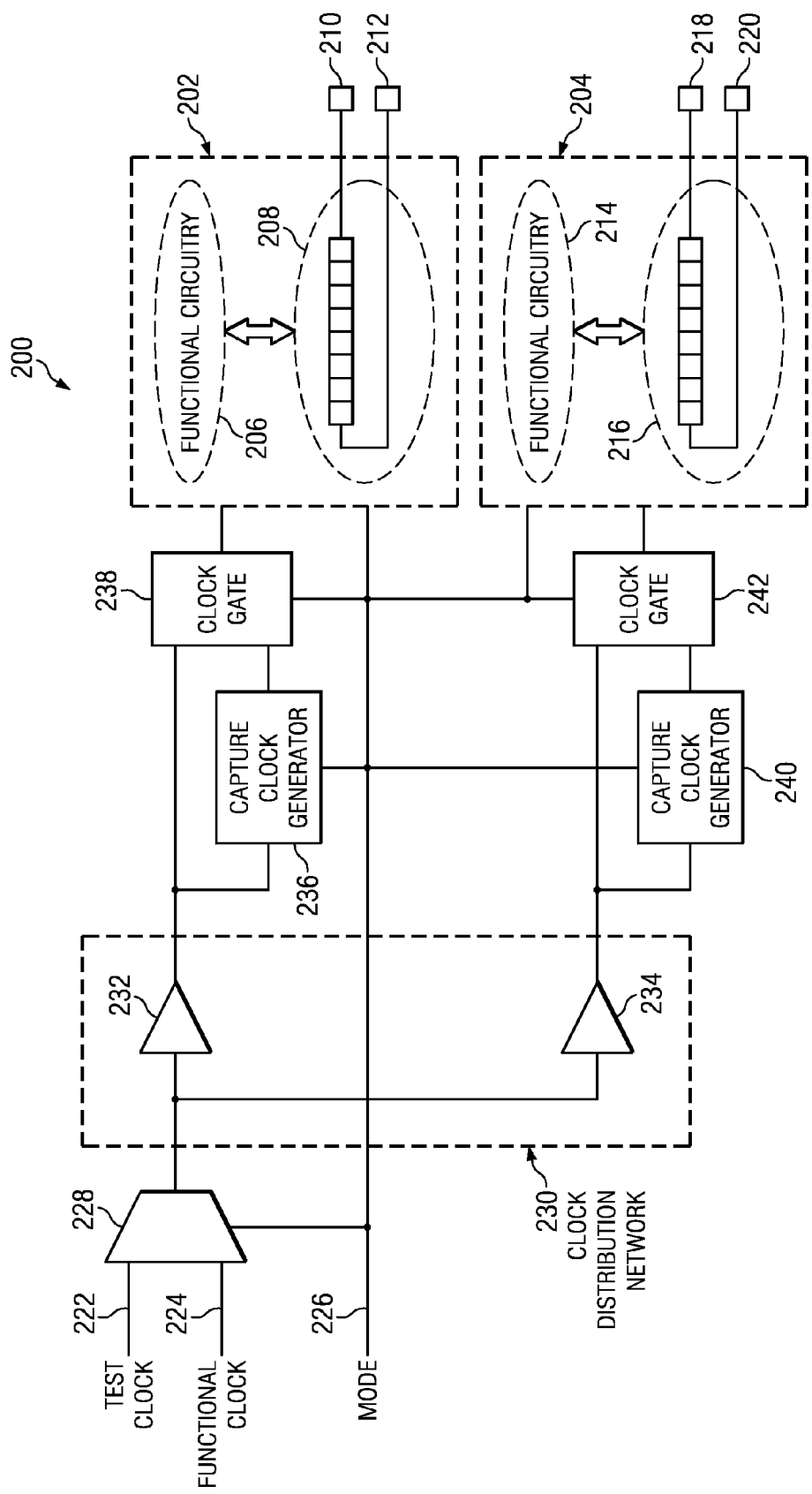
FIG. 2A is a simplified block diagram illustrating an example embodiment of an electronic system configured for scan testing.

FIG. 2A illustrates an example electronic system 200 with provision for scan testing. System 200 may be, for example, a processor system, a signal processing system, an Application Specific Integrated Circuit, or some other complex system for which scan testing is appropriate. System 200 may be an integrated circuit, or a printed circuit board, or some other assembly. System 200 has been split into at least two different functional blocks 202 and 204. Block 202 comprises Functional Circuitry 206 and Test Circuitry 208. Test Circuitry 208 comprises a plurality of storage elements configured as a shift register. Stimulus data is serially shifted into the shift register through a Test Access Port 210. Captured test results are serially shifted out through a TAP 212. Block 204 comprises Functional Circuitry 214 and Test Circuitry 216. Test Circuitry 216 comprises a plurality of storage elements configured as a shift register. Stimulus data is serially shifted into the shift register through a Test Access Port 218. Captured test results are serially shifted out through a TAP 220. TAP 212 may be optionally attached to TAP 218 so that the Test Circuitry portions of all the functional blocks are connected in a chain.

Example system 200 includes a Clock Distribution Network 230. For purposes of illustration, the Clock Distribution Network 230 is depicted a having a single level and two drivers (232, 234). In an actual implementation, the Clock Distribution Network 230 may have multiple levels and many drivers, configured, for example, in a tree or mesh structure. In such a structure, driver 232 represents a driver in the lowest level driving block 202, and driver 234 represents a driver in the lowest level driving block 204. In the example system 200, a Clock Gate 238 is between driver 232 and block 202, and a Clock Gate 242 is between driver 234 and block 204. Clock Gate 238 is driven by driver 232 and by a Capture Clock Generator 236. Clock Gate 242 is driven by driver 234 and a Capture Clock Generator 240.

In example system 200, a multiplexer 228 selects between a low-frequency Test Clock 222 and a high-frequency Functional Clock 224, depending on the state of a Mode signal 226. The multiplexer 228 provides the input to the Clock Distribution Network 230.

Figure 2B:
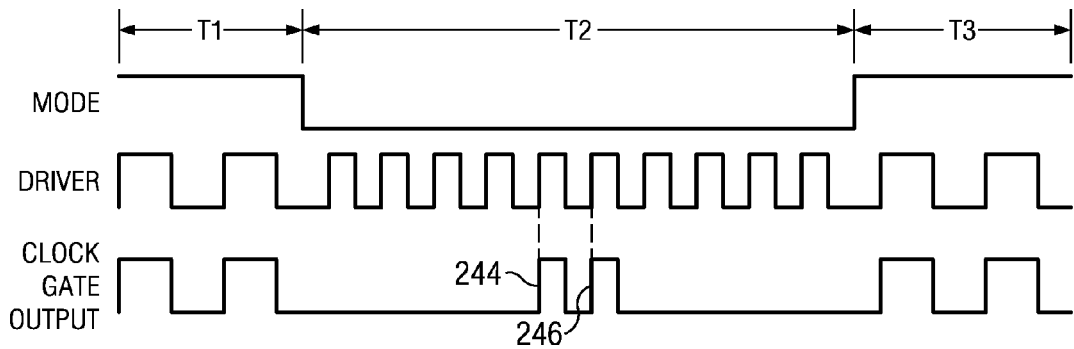
FIG. 2B is a timing diagram illustrating example timing for various signals in the system of FIG. 2A.

FIG. 2B illustrates example timing for Mode signal 226, the output of the drivers (232, 234), and the output of the Clock Gates (238, 242). During time T1, the Mode signal 226 is high, designating a scan mode, and the multiplexer 228 drives the Clock Distribution Network 230 with the low-frequency Test Clock 222, and the Clock Gates (238, 242) drive the blocks (202, 204) with the low-frequency Test Clock 222. During time T1, Test Circuitry 208 and 216 scan (shift) in a test vector through a TAP (210, 218), and may shift out previously captured test results. During time T2, the Mode signal 226 is low, designating a capture mode, and the multiplexer 228 drives the Clock Distribution Network 230 with the high-frequency Functional Clock 224. During time T2, the Capture Clock Generators (236, 240) generate, for example, two capture pulses (244, 246), and the Clock Gates (238, 242) drive the blocks (202, 204) with the outputs of the Capture Clock Generators (236, 240). During time T3, the Mode signal 226 returns high, designating a scan mode, and the multiplexer 228 drives the Clock Distribution Network 230 with the low-frequency Test Clock 222, and the Clock Gates (238, 242) drive the blocks (202, 204) with the low-frequency Test Clock 222. During time T3, the Test Circuitry (208, 216) shifts out captured test data through a TAP (212, 220), and may shift in new test vectors.

As seen in FIG. 2B, the Clock Distribution Network is always active, always being driven by the low-frequency Test Clock 222, or the high-frequency Functional Clock 224. In addition, when the mode switches from scan mode to capture mode, the Clock Distribution Network is driven by multiple high-frequency Functional Clock pulses before the first capture pulse 244 is generated. This allows the Clock Distribution Network to stabilize at the new frequency. As a result, the first capture pulse 244 sees almost the same network conditions as the second capture pulse (there may still be some network effects within blocks 202 and 204, but the location of the Clock Gates is downstream of a substantial portion of the clock network).

By dividing the system into blocks, each block may have a separate power supply trace and filter capacitor, reducing any transient voltage dip resulting from circuits switching states at the first capture pulse 244. In addition, as will be discussed in more detail later, the Capture Clock Generators may optionally be configured to provide capture pulses to different blocks at different non-overlapping times, or to not provide any capture pulses to a block. This can be used to further reduce any transient voltage dips resulting from circuits switching states at a first capture pulse.

Figure 3A:
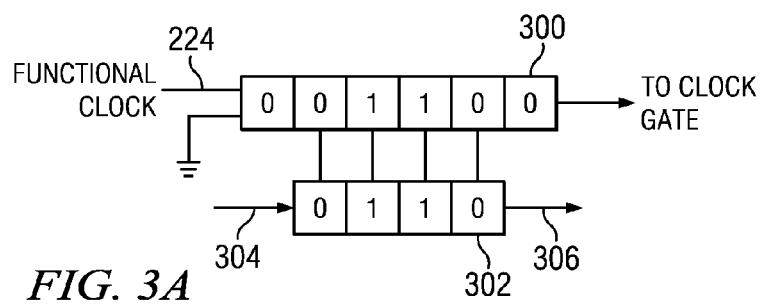
FIG. 3A is a simplified block diagram illustrating additional detail for an example embodiment of a Capture Clock Generator in the example system of FIG. 2A.
Figure 3B:
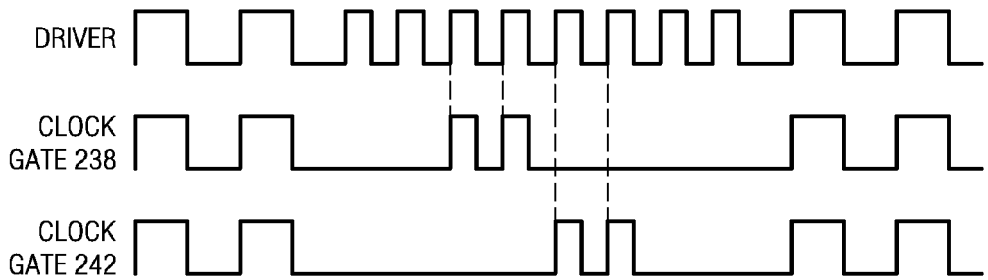
FIG. 3B is a timing diagram illustrating example timing for capture pulses that may be generated by the Capture Clock Generator of FIG. 3A.

FIG. 3A illustrates an example embodiment of a Capture Clock Generator (FIG. 2A, 236, 240). The example Capture Clock Gate in FIG. 3A has two portions, a primary shift register 300 and a shadow shift register 302. The primary shift register 300 is illustrated as having six stages, but the number of stages is arbitrary and the number six is for illustration only. In the example embodiment of FIG. 3A, the shadow register is programmed once before testing begins, and is not clocked afterward. All shadow registers may be connected in series to facilitate serial programming by shifting. That is, input 304 may be connected to the output of a shadow register of another functional block (or may be the first programming input), and output 306 may be connected to the input of a shadow register of another functional block (or may be the end of a chain of shadow registers). When the Mode signal (FIG. 2A, 226) goes low (capture mode), the fixed contents of the shadow register 302 are copied to the center four stages of the primary shift register 300. The primary shift register 300 is clocked by the Functional Clock 224 when the Mode signal is low (capture mode), shifting to the right one stage at each rising edge of the Functional Clock, and generating a pulse if the last stage has a value of "one". With six stages as illustrated in FIG. 3A, and with the shadow register 302 programmed as illustrated in FIG. 3A, the primary shift register generates two capture pulses as illustrated in FIG. 3B. The input to the first register in the primary shift register 300 is ground, so after six clock cycles all six stages have a value of zero. Then, when the primary register 300 is loaded again by the shadow register 302, the first and last stages have a value of zero. This provides some time for the Mode signal to change states asynchronously and with non-critical timing. In FIG. 2B, there is more than one Functional Clock pulse illustrated before and after the capture pulses, but again, the number of stages in FIG. 3A is for purposes of illustration only.

Assume for purposes of illustration that each primary register has eight stages and each shadow register has six stages. Assume further that the shadow register in Capture Clock Generator 236 is programmed to have the value 000110, and the shadow register in Capture Clock Generator 240 is programmed to have the value 011000. FIG. 3B illustrates the resulting timing for the outputs of Clock Gates 238 and 242. Note that the capture pulses for block 202 do not overlap with the capture pulses for block 204. This reduces power supply transient issues, and also may be useful for testing transfer of data between functional blocks. As an alternative, one or more shadow registers may be programmed with all zeros, so that no capture pulses are generated for one or more functional blocks. This may also be useful to reduce power supply transients.

Figure 4:
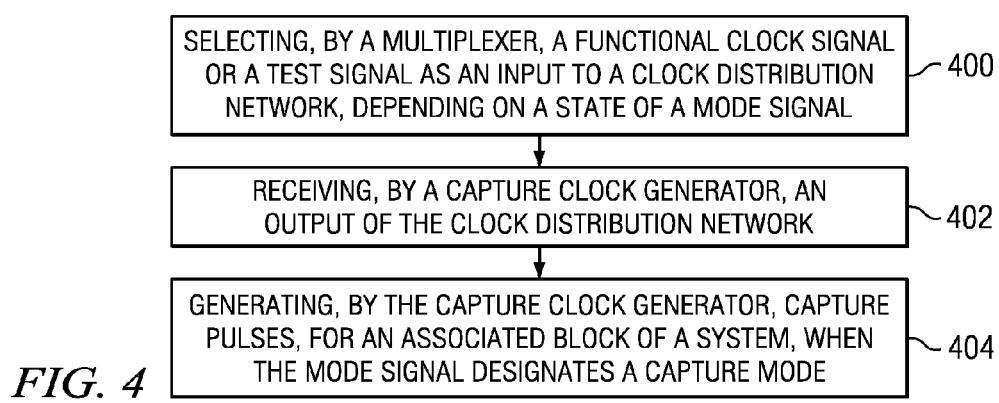
FIG. 4 is a flow chart of an example method of testing an electronic system.

FIG. 4 illustrates a method of scan testing for a system. Note that order of the steps in the figure does not imply a required order in the method, and some steps may occur simultaneously. At step 400, a multiplexer selects a functional clock signal or a test signal as an input to a clock distribution network, depending on a state of a mode signal. At step 402, a capture clock generator receives an output of the clock distribution network. At step 404, the capture clock generator generates capture pulses for an associate block of a system when the mode signal designates a capture mode.

From the above, it can be seen that the system of FIGS. 2A and 3A, compared to the system of FIG. 1A, provides more accurate timing between capture pulses, and provides programming flexibility for when (or if) capture pulses occur.

What is claimed is:

1. An electronic system, comprising:
   a plurality of blocks;
   a clock distribution network configured to distribute a clock signal to each of the blocks; scan test circuitry within each block;
   capture pulse generation circuitry, associated with each block, configured to receive the clock signal from the clock distribution network and to generate clock pulses for the associated block during a capture mode.

2. The electronic system of claim 1, where the capture pulse generation circuitry associated with a first block is configured to generate clock pulses at a different time than the capture pulse generation circuitry for a second block.

3. The electronic system of claim 1, where the capture pulse generation circuitry associated with a least one block is configured to not generate any clock pulses for the associated block.

4. The electronic system of claim 1, the capture pulse generation circuitry further comprising a shift register, configured to shift one stage for each cycle of the clock signal, and configured to produce a capture pulse when the output of the last stage is a logical one.

5. The electronic system of claim 4, the capture pulse generation circuitry further receiving a mode signal, the capture pulse generation circuitry further comprising a shadow register, configured to transfer the contents of the shadow register to the shift register when the mode signal designates a capture mode.

6. The electronic system of claim 5, where logical ones programmed into the shadow register associated with a first block are in different register locations than logical ones programmed into the shadow register associated with a second block.

7. The electronic system of claim 5, where the shadow register associated with at least one block is programmed with all zeros.

8. The electronic system of claim 5, where the shadow registers of at least two blocks are connected in series.

9. The electronic system of claim 5, where the shadow register is configured to be programmed only once for more than one scan test.

10. The electronic system of claim 1, further comprising a multiplexer receiving a test clock signal, a functional clock signal, and a mode signal, the multiplexer selecting one of the test clock signal and the functional clock signal as an input to the clock distribution network, depending on the state of the mode signal.

11. The electronic system of claim 10, where the clock distribution network receives the functional clock signal for the entire period when the mode signal designates a capture mode.

12. A method of scan testing for an electronic system, the method comprising:
    selecting, by a multiplexer, a functional clock signal or a test signal as an input to a clock distribution network, depending on a state of a mode signal;
    receiving, by a capture clock generator, an output of the clock distribution network; and
    generating, by the capture clock generator, capture pulses, for an associated block of the electronic system, when the mode signal designates a capture mode.

13. The method of claim 12, the step of generating further comprising:
    generating, by a first capture clock generator, first capture pulses for a first block of the electronic system; and,
    generating, by a second capture clock generator, second capture pulses for a second block of the electronic system, where the second capture pulses occur at a different time than the first capture pulses.

14. The method of claim 12, the step of generating further comprising:
    generating, by a first capture clock generator, capture pulses for a first block of the electronic system; and,
    generating, by a second capture clock generator, no capture pulses for a second block of the electronic system.

15. The method of claim 12, the step of generating further comprising:
    storing, in a stage of a shift register, a logical value;
    shifting the logical value one stage of the shift register at each cycle of the functional clock signal; and,
    generating a capture pulse when the logical value reaches the last stage of the shift register.

16. An electronic system configured for scan testing, comprising:
    a clock distribution network configured to distribute to a plurality of blocks of the system; and,
    a test capture clock being generated locally at each block, where capture clock pulses are optionally generated at different times for different blocks, and capture clock pulses are optionally suppressed for some blocks.

17. The electronic system of claim 16, further comprising:
    each test capture clock being generated by capture pulse generation circuitry that is local to each block, the capture pulse generation circuitry further comprising a shift register, configured to shift one stage for each cycle of a clock signal, and configured to produce a capture pulse when the output of the last stage is a logical one.

18. The electronic system of claim 17, the capture pulse generation circuitry further receiving a mode signal, the capture pulse generation circuitry further comprising a shadow register, configured to transfer the contents of the shadow register to the shift register when the mode signal designates a capture mode.

19. The electronic system of claim 18, where logical ones programmed into the shadow register associated with a first block are in different register locations than logical ones programmed into the shadow register associated with a second block.

20. The electronic system of claim 18, where the clock distribution network receives a functional clock signal for the entire period when the mode signal designates a capture mode.

* * * * *